(12) United States Patent
Nakayashiki et al.

(10) Patent No.: US 8,426,724 B2
(45) Date of Patent: Apr. 23, 2013

(54) INTERDIGITATED BACK CONTACT SILICON SOLAR CELLS WITH SEPARATING GROOVES

(75) Inventors: Kenta Nakayashiki, Sandvika (NO); Baomin Xu, San Jose, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 199 days.

(21) Appl. No.: 12/954,234

(22) Filed: Nov. 24, 2010

(65) Prior Publication Data

US 2011/0070681 A1   Mar. 24, 2011

Related U.S. Application Data

(62) Division of application No. 12/207,446, filed on Sep. 9, 2008, now Pat. No. 7,999,175.

(51) Int. Cl.
*H02N 6/00* (2006.01)
*H01L 31/00* (2006.01)

(52) U.S. Cl.
USPC ............ 136/255; 136/243; 136/244

(58) Field of Classification Search ......... 136/243, 136/244, 255
See application file for complete search history.

(56) References Cited

U.S. PATENT DOCUMENTS

| | | |
|---|---|---|
| 3,973,994 A | 8/1976 | Redfield |
| 4,104,091 A | 8/1978 | Evans, Jr. et al. |
| 4,153,476 A | 5/1979 | Shelpuk et al. |
| 4,205,216 A | 5/1980 | Douglas |
| 4,223,202 A | 9/1980 | Peters et al. |
| 4,330,680 A | 5/1982 | Goetzberger |
| 4,355,196 A | 10/1982 | Chai |
| 4,479,027 A | 10/1984 | Todorof |

(Continued)

FOREIGN PATENT DOCUMENTS

| CN | 1346517 A | 4/2002 |
|---|---|---|
| CN | 1211862 C | 7/2005 |

(Continued)

OTHER PUBLICATIONS

Cuevas et al. "50 Per Cent More Output Power from an Albedo-Collecting Flat Panel Using Bifacial Solar Cells", Solar Energy, vol. 29, No. 5, pp. 419-420, 1982.

(Continued)

*Primary Examiner* — Jennifer Michener
*Assistant Examiner* — Shannon Gardner
(74) *Attorney, Agent, or Firm* — Bever, Hoffman & Harms, LLP; Patrick T. Bever (57) ABSTRACT

Interdigitated back contact (IBC) solar cells are produced by depositing spaced-apart parallel pads of a first dopant bearing material (e.g., boron) on a substrate, heating the substrate to both diffuse the first dopant into corresponding first (e.g., p+) diffusion regions and to form diffusion barriers (e.g., borosilicate glass) over the first diffusion regions, and then disposing the substrate in an atmosphere containing a second dopant (e.g., phosphorus) such that the second dopant diffuses through exposed surface areas of the substrate to form second (e.g., n+) diffusion regions between the first (p+) diffusion regions (the diffusion barriers prevent the second dopant from diffusion into the first (p+) diffusion regions). The substrate material along each interface between adjacent first (p+) and second (n+) diffusion regions is then removed (e.g., using laser ablation) such that elongated grooves, which extend deeper into the substrate than the diffused dopant, are formed between adjacent diffusion regions.

16 Claims, 6 Drawing Sheets

U.S. PATENT DOCUMENTS

| | | |
|---|---|---|
| 4,533,814 A | 8/1985 | Ward |
| 4,540,843 A | 9/1985 | Gochermann et al. |
| 4,589,191 A | 5/1986 | Green et al. |
| 4,602,120 A | 7/1986 | Wakefield et al. |
| 4,609,037 A | 9/1986 | Wheeler et al. |
| 4,640,001 A * | 2/1987 | Koiwai et al. ............ 438/72 |
| 4,650,294 A | 3/1987 | Nanno et al. |
| 4,796,038 A | 1/1989 | Allen et al. |
| 4,826,777 A | 5/1989 | Ondris |
| 4,896,015 A | 1/1990 | Taboada et al. |
| 4,933,623 A | 6/1990 | Fox |
| 4,996,405 A | 2/1991 | Poumey et al. |
| 5,011,565 A | 4/1991 | Dube et al. |
| 5,029,955 A | 7/1991 | Chu |
| 5,075,281 A | 12/1991 | Testardi |
| 5,151,377 A | 9/1992 | Hanoka et al. |
| 5,213,628 A | 5/1993 | Noguchi et al. |
| 5,296,671 A | 3/1994 | Torii et al. |
| 5,356,488 A | 10/1994 | Hezel |
| 5,449,413 A | 9/1995 | Beauchamp et al. |
| 5,468,652 A * | 11/1995 | Gee ............................. 438/98 |
| 5,538,563 A | 7/1996 | Finkl |
| 5,543,333 A | 8/1996 | Holdermann |
| 5,569,399 A | 10/1996 | Penney et al. |
| 5,665,175 A | 9/1997 | Safir |
| 5,751,436 A | 5/1998 | Kwon et al. |
| 5,863,338 A | 1/1999 | Yamada et al. |
| 5,916,461 A | 6/1999 | Costin et al. |
| 5,929,530 A | 7/1999 | Stone |
| 5,981,902 A | 11/1999 | Arita et al. |
| 5,990,413 A | 11/1999 | Ortabasi |
| 6,032,997 A | 3/2000 | Elliott et al. |
| 6,072,157 A | 6/2000 | Klebanoff et al. |
| 6,164,633 A | 12/2000 | Mulligan et al. |
| 6,180,869 B1 | 1/2001 | Meier et al. |
| 6,183,186 B1 | 2/2001 | Howells et al. |
| 6,185,030 B1 | 2/2001 | Overbeck et al. |
| 6,203,621 B1 | 3/2001 | Tran et al. |
| 6,232,217 B1 | 5/2001 | Ang et al. |
| 6,291,763 B1 * | 9/2001 | Nakamura ............... 136/256 |
| 6,310,281 B1 | 10/2001 | Wendt et al. |
| 6,323,415 B1 | 11/2001 | Uematsu et al. |
| RE37,512 E | 1/2002 | Szlufcik et al. |
| 6,351,098 B1 | 2/2002 | Kaneko |
| 6,354,791 B1 | 3/2002 | Wytman et al. |
| 6,410,843 B1 | 6/2002 | Kishi et al. |
| 6,413,113 B2 | 7/2002 | Uher et al. |
| 6,429,037 B1 | 8/2002 | Wenham et al. |
| 6,459,418 B1 | 10/2002 | Comiskey et al. |
| 6,555,739 B2 | 4/2003 | Kawam |
| 6,628,446 B1 | 9/2003 | Shahar et al. |
| 6,667,434 B2 | 12/2003 | Morizane et al. |
| 6,924,493 B1 | 8/2005 | Leung |
| 6,979,798 B2 | 12/2005 | Gu et al. |
| 7,002,675 B2 | 2/2006 | MacGibbon et al. |
| 7,129,592 B1 | 10/2006 | Yetter |
| 7,388,147 B2 | 6/2008 | Mulligan et al. |
| 7,394,016 B2 | 7/2008 | Gronet |
| 2001/0008230 A1 | 7/2001 | Keicher et al. |
| 2002/0060208 A1 | 5/2002 | Liu et al. |
| 2002/0079445 A1 | 6/2002 | Hantschel et al. |
| 2002/0127953 A1 | 9/2002 | Doan et al. |
| 2002/0154396 A1 | 10/2002 | Overbeck |
| 2003/0095175 A1 | 5/2003 | Agorio |
| 2003/0099022 A1 | 5/2003 | Karin et al. |
| 2003/0129810 A1 | 7/2003 | Barth et al. |
| 2003/0213429 A1 | 11/2003 | Kreuzer |
| 2004/0012676 A1 | 1/2004 | Weiner |
| 2004/0048001 A1 | 3/2004 | Kiguchi et al. |
| 2004/0200520 A1 | 10/2004 | Mulligan et al. |
| 2005/0000566 A1 | 1/2005 | Posthuma et al. |
| 2005/0133084 A1 | 6/2005 | Joge et al. |
| 2005/0212139 A1 | 9/2005 | Leinikka et al. |
| 2005/0221613 A1 | 10/2005 | Ozaki et al. |
| 2005/0253308 A1 | 11/2005 | Sherwood |
| 2006/0046269 A1 | 3/2006 | Thompson et al. |
| 2006/0076105 A1 | 4/2006 | Furui et al. |
| 2006/0130891 A1 * | 6/2006 | Carlson .................. 136/256 |
| 2006/0251796 A1 | 11/2006 | Fellingham |
| 2006/0266235 A1 | 11/2006 | Sandhu et al. |
| 2008/0116183 A1 | 5/2008 | Curry |
| 2008/0138456 A1 * | 6/2008 | Fork et al. ................. 425/113 |

FOREIGN PATENT DOCUMENTS

| | | |
|---|---|---|
| DE | 29824597 U1 | 9/2001 |
| EP | 0257157 A | 3/1988 |
| EP | 0851511 A | 7/1998 |
| EP | 1145797 A | 10/2001 |
| EP | 1351318 A | 10/2003 |
| EP | 1763086 A | 3/2007 |
| EP | 1833099 A | 9/2007 |
| EP | 1925964 A1 | 5/2008 |
| GB | 394285 A | 6/1933 |
| JP | 02055689 A | 2/1990 |
| JP | 02-187291 A | 7/1990 |
| JP | 7-326786 A | 12/1995 |
| JP | 11-214725 A | 8/1999 |
| JP | 2002111035 A | 4/2002 |
| JP | 2004-228450 A | 8/2004 |
| JP | 2004266023 A | 9/2004 |
| JP | 2005-236235 A | 9/2005 |
| WO | 91/08503 A | 6/1991 |
| WO | 92/15845 A | 9/1992 |
| WO | 97/21253 A | 6/1997 |
| WO | 97/48519 A | 12/1997 |
| WO | 98/54602 A2 | 12/1998 |
| WO | 02/052250 A | 7/2002 |
| WO | 03/047005 A | 6/2003 |
| WO | 2006/097303 A1 | 9/2006 |
| WO | 2007/088529 A1 | 8/2007 |

OTHER PUBLICATIONS

Taguchi et al. "An Approach for the Higher Efficiency in the HIT Cells", IEEE, pp. 866-871, 2005.

Kerschaver et al. "Back-contact Solar Cells: A Review", Progress in Photovoltaics: Research and Applications, 2006, vol. 14, pp. 107-123.

Kranzl et al. "Bifacial Solar Cells on Multi-Crystalline Silicon", 15th International Photovoltaic Science & Engineering Conference, Shanghai, China, 2 pages, 2005.

Mauk et al. "Buried Metal/Dielectric/Semiconductor Reflectors for Light Trapping in Epitaxial Thin-Film Solar Cells", May 1996, IEEE, 25th PVSC, pp. 147-150.

Ruthe et al. "Etching of CuInSe2 Thin Films-Comparison of Femtosecond and Picosecond Laser Ablation", Applied Surface Science, vol. 247, No. 1-4, Jul. 15, 2005, pp. 447-452.

Kenis et al. "Fabrication inside Microchannels Using Fluid Flow", Accounts of Chemical Research, vol. 33, No. 12, 2000, pp. 841-847.

Hitachi: Offering Total Environmental Solutions, Environmental Activities, http://greenweb.hitachi.co.jp/en/sustainable/total-solution.html, 5 pages, 2003.

Neuhaus et al. "Industrial Silicon Wafer Solar Cells", Advances in OptoElectronics, vol. 2007, 2007, 15 pages.

Recart et al. "Large Area Thin BSF Solar Cells With Simultaneously Diffused Boron and Phosphorus Screen Printed Emitters", IEEE, pp. 1213-1216, 2005.

Szlufcik et al. "Low-Cost Industrial Technologies of Crystalline Silicon Solar Cells", Proc. of the IEEE, vol. 85, No. 5, May 1, 1997, pp. 711-730.

Cousins et al. "Manufacturing and Design Issues for Thin Silicon Solar Cells Manufactured on FZ(B), MCZ(B), CZ(Ga) and CZ(B) Wafers", IEEE, pp. 987-990, 2005.

Weber et al. "Modelling of Sliver® Modules Incorporating a Lambertian Rear Reflector", The Australian National University, Canberra ACT 0200, Australia, 4 pages, 2005.

Brogren et al. "Optical properties, durability, and system aspects of a new aluminum-polymer-laminated steel reflector for solar concentrators", Jan. 2004, Solar Energy Materials and Solar Cells, 82, pp. 387-412.

Nijs et al. "Overview of solar cell technologies and results on high efficiency multicrystalline silicon substrates", Solar Energy Materials and Solar Cells, vol. 48, No. 1-4, Nov. 1, 1997, pp. 199-217.

Sanyo Solar Panels, Sanyo HIT Solar Panel Discount—Solar Electric Supply, Sanyo Solar Modules, http://www.solarelectricsupply.com/Solar_Panels/Sanyo/sanyo.html, 4 pages, 2005.

SunPower Corp. News Release, May 12, 2008, Available URL: http://investors.sunpowercorp.com/releasedetail.cfm?ReleaseID=309613.

Munzer et al. "Thin Monocrystalline Silicon Solar Cells", Oct. 1999, IEEE Transactions on Electron Devices, vol. 46, No. 10, pp. 2055-2061.

Sundararajan et al. "Three-Dimensional Hydrodynamic Focusing in Polydimethylsiloxane (PDMS) Microchannels", Journal of Microelectromechanical Systems, vol. 13, No. 4, Aug. 2004, pp. 559-567.

\* cited by examiner

INTERDIGITATED BACK CONTACT SILICON SOLAR CELLS WITH SEPARATING GROOVES

RELATED APPLICATIONS

This application is a divisional of U.S. patent application Ser. No. 12/207,446, entitled "Interdigitated Back Contact Silicon Solar Cells With Laser Ablated Grooves" filed Sep. 9, 2008.

FIELD OF THE INVENTION

This invention relates to the conversion of light irradiation to electrical energy using photovoltaic devices (solar cells), more particularly, to methods and tools for producing interdigitated back contact (IBC) solar cells, and to the IBC solar cells produced by these methods.

BACKGROUND OF THE INVENTION

Solar cells are typically photovoltaic devices that convert sunlight directly into electricity. Solar cells typically include a semiconductor (e.g., silicon) wafer (substrate) that absorbs light irradiation (e.g., sunlight) in a way that creates free electrons, which in turn are caused to flow in the presence of a built-in field to create direct current (DC) power. The DC power generated by several solar cells may be collected on a grid placed on the cell. Solar cells are typically made using square or quasi-square silicon wafers that are doped to include one or more n-type doped regions, and one or more p-type doped regions. Such solar cells (also known as silicon wafer-based solar cells) are currently the dominant technology in the commercial production of solar cells, and are the main focus of the present invention.

A desirable solar cell geometry, commonly referred to as the interdigitated back contact (IBC) cell, consists of a semiconductor wafer, such as silicon, and alternating lines (interdigitated stripes) of p-type and n-type doping. This cell architecture has the advantage that all of the electrical contacts to the p and n regions can be made to one side of the wafer. When the wafers are connected together into a module, the wiring is all done from one side. Device structure and fabrication means for this device have been described previously in co-owned and co-pending U.S. patent application Ser. No. 11/336,714 entitled "Solar Cell Production Using Non-Contact Patterning and Direct-Write Metallization", which is incorporated herein by reference in its entirety. On May 12, 2008, SunPower Corp. (San Jose, Calif., USA) announced achieving 23.4% efficiency in a prototype IBC cell (see http://investors.sunpowercorp.com/releasedetail.cfm?ReleaseID=309613).

A problem with IBC solar cells is that the conventional fabrication process used to produce IBC cells is quite complicated and, hence, more expensive as compared to the fabrication processes require to produce conventional 'H-pattern' solar cells. According to D. H. Neuhaus and A. Munzer, "Industrial Silicon Wafer Solar Cells" (Advances in Optoelectronics, vol. 2007, pp. 1-15, 2007), IBC cells require seventeen process steps (minimum) in order to complete the cell fabrication process, whereas conventional H-pattern solar cells require only nine steps.

What is needed is a method for producing IBC-type solar cells that overcomes the deficiencies of conventional production methods by reducing the manufacturing costs and complexity, whereby IBC-type solar cells can be produced at substantially the same or lower cost as conventional H-pattern solar cells.

SUMMARY OF THE INVENTION

The present invention is directed to a method for fabricating IBC solar cells that includes combining phosphorus and boron diffusion processes in which a screen-printable or spin-on-dopant boron source is deposited on the rear surface of a crystalline silicon substrate, and then phosphorus dopant is diffused such that the boron source acts as a diffusion barrier for phosphorus diffusion to prevent a cross doping of p+ and n+ diffusion regions. After the diffusion process, p+ and n+ diffusion regions are separated by grooves that are formed in the rear surface between the adjacent p+ and n+ diffusion regions, e.g., by laser ablation or chemical etching. The resulting fabrication process reduces the number of processing steps by approximately half (in comparison to conventional methods), and facilitates producing IBC solar cells at approximately the same (or lower) cost as currently required to produce 'H-pattern' solar cells.

BRIEF DESCRIPTION OF THE DRAWINGS

These and other features, aspects and advantages of the present invention will become better understood with regard to the following description, appended claims, and accompanying drawings, where:

DETAILED DESCRIPTION OF THE DRAWINGS

The present invention relates to an improvement in photovoltaic devices (e.g., solar cells) that can be used, for example, to convert solar power into electrical energy. The following description is presented to enable one of ordinary skill in the art to make and use the invention as provided in the context of a particular application and its requirements. As used herein, directional terms such as "upper", "lower", "side", "front", "rear", and "vertical" are intended to provide relative positions for purposes of description, and are not intended to designate an absolute frame of reference. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 1:
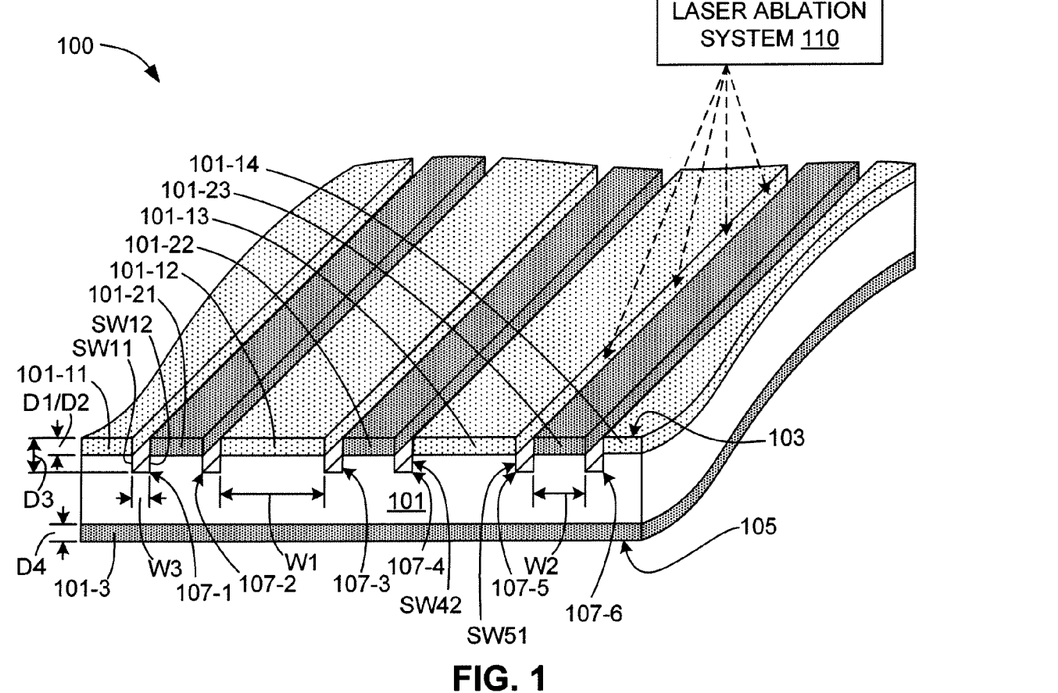
FIG. 1 is a perspective view showing a partially fabricated IBC solar cell according to an embodiment of the present invention.
Figure 2:
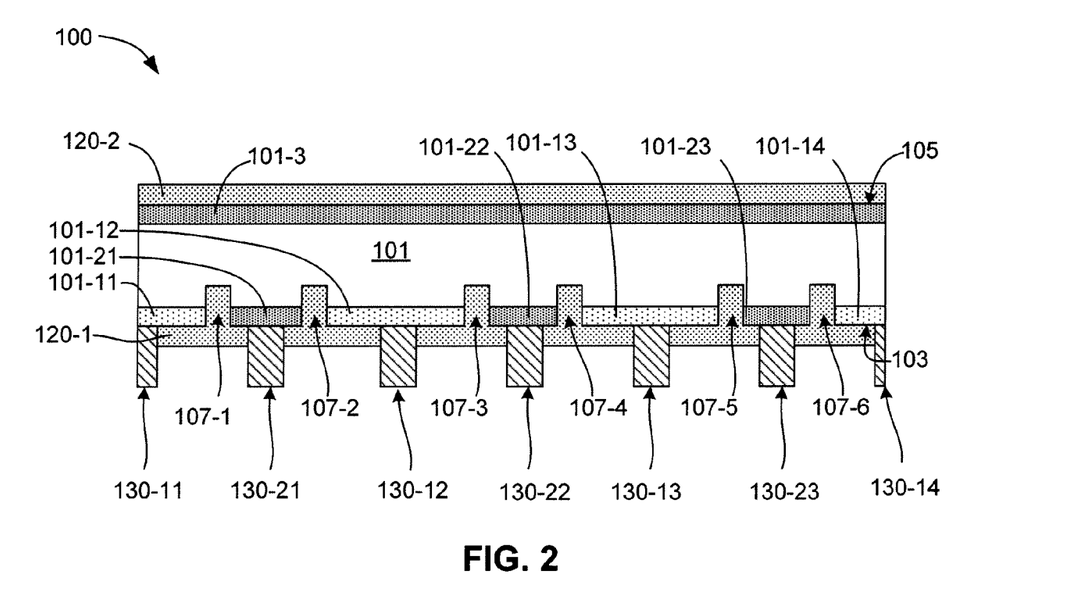
FIG. 2 is a cross-sectional side view showing the IBC solar cell of FIG. 1 in a substantially completed state.

FIG. 1 is a partial perspective view and FIG. 2 is a cross-sectional side view showing a simplified IBC solar cell 100 according to an embodiment of the present invention. Those skilled in the art will recognize that FIGS. 1 and 2 are simplified to show only a few diffusion lines and utilizes a distorted scale in order to highlight key features of the invention.

Referring to FIG. 1, IBC solar cell 100 is formed on a semiconductor silicon (Si) wafer (substrate) 101 having a rear surface 103 and an opposing front surface 105. Substrate 101 includes several diffusion regions that are indicated in FIG. 1 by shading, and unshaded portions of substrate 101 represent standard semiconductor Si. In one embodiment, the semiconductor Si is an n-type monocrystalline wafer with the resistivity between 0.1 and 2000 Ω·cm, but other type Si materials, such as p-type monocrystalline Si wafer, and n-type or p-type multicrystalline Si wafers, can also be used. Similar to conventional IBC solar cells, IBC solar cell 100 includes multiple interdigitated (parallel, spaced-apart) diffusion regions 101-11 to 101-14 and 101-21 to 101-23 that are formed through rear surface 103, and a continuous blanket (fourth) diffusion region 101-3 that is formed through front surface 105. A first set of diffusion regions 101-11 to 101-14 include a p-type dopant (e.g., boron) having a sheet resistance between 20 and 200 Ω/square, and a second set of diffusion regions 101-21 to 101-23 include a n-type dopant (e.g., phosphorus) having a sheet resistance between 20 and 200 Ω/square. The p-type dopant is diffused into substrate 101 such that diffusion regions 101-11 to 101-14 have a nominal depth D1 between 0.1 and 5 µm, measured from rear surface 103 as indicated in FIG. 1, and has a width W1 in the range of 100 to 3000 µm. The n-type dopant is diffused into substrate 101 such that diffusion regions 101-21 to 101-23 have a nominal depth D2 of 0.1 to 5 µm, measured from rear surface 103 as indicated in FIG. 1, and has a width W2 in the range of 10 to 500 µm. The diffusion regions are arranged such that each of the second set of diffusion regions 101-21 to 101-23 is disposed between a corresponding pair of diffusion regions of the first set. For example, a (third) n+ diffusion region 101-22 is disposed between a (first) p+ diffusion region 101-12 and a (second) n+ diffusion region 101-13.

According to an aspect of the present invention, a series of grooves 107-1 to 107-6 that are defined into rear surface 103 between adjacent pairs of the diffusion regions. Grooves 107-1 to 107-6 represent elongated voids or openings in rear surface 103 where substrate material is removed from between adjacent diffusion regions. For example, p+ diffusion region 101-12 is separated from n+ diffusion region 101-22 by (third) groove 107-3, and p+ diffusion region 101-13 is separated from n+ diffusion region 101-22 by a groove 107-4. Each groove 107-1 to 107-6 has a (third) depth D3 (e.g., preferably in the range of 0.2 to 10 µm, and more preferably in the range of 0.5 to 1.5 µm) extending into substrate 101 from rear surface 103 that is greater than depths D1 and D2, whereby each adjacent pair of diffusion regions are physically separated from each other by a corresponding groove (e.g., diffusion regions 101-12 and 101-22 are separated by groove 107-3).

In accordance with another aspect of the present invention, grooves 107-1 to 107-6 are formed such that each diffusion region extends continuously between corresponding (vertical) side walls of two adjacent associated grooves. That is, each groove has a width W3 (i.e., preferably in the range of 1 to 50 µm, and more preferably in the range of 1 to 10 µm) defined by a distance between opposing vertical side walls (e.g., groove 107-1 has a width W3 measured between side walls SW11 and SW12). Each diffusion region extends between associated side walls of adjacent grooves. For example, diffusion region 101-12 extends between side wall SW42 of groove 107-4 and side wall SW51 of groove 107-5. As set forth below, grooves 107-1 to 107-6 are formed such that the entire region between side walls SW42 and SW51 to the depth D1 has the p-type dopant (e.g., boron) that forms diffusion region 101-13.

IBC solar cell 100 is shown in a substantially completed state in FIG. 2, wherein a surface passivation layer 120-1 (e.g., one of $SiN_x$, $SiC_x$, $SiO_2$, $SiO_2/SiN_x$, or any other suitable dielectric materials) is formed over rear surface 103, and an anti-reflection layer 120-2 (e.g., $SiN_x$, $TiO_2$, or any other suitable dielectric materials) is formed over front surface 105, whereby diffusion regions 101-11 to 101-14, 101-21 to 101-23 and 101-3 are protected by the respective layers. In accordance with another aspect of the invention, grooves 107-1 to 107-6 are formed such that portions of passivation layer 120-1 are respectively disposed in each groove. Metal contacts 130-11 to 130-14 (e.g., AgAl) extend through passivation layer 120-1 and are respectively connected to p+ diffusion regions 101-11 and 101-14, and metal contacts 130-21 to 130-23 (e.g., Ag) extend through passivation layer 120-1 and are respectively connected to n+ diffusion regions 101-21 and 101-23.

Figure 3:
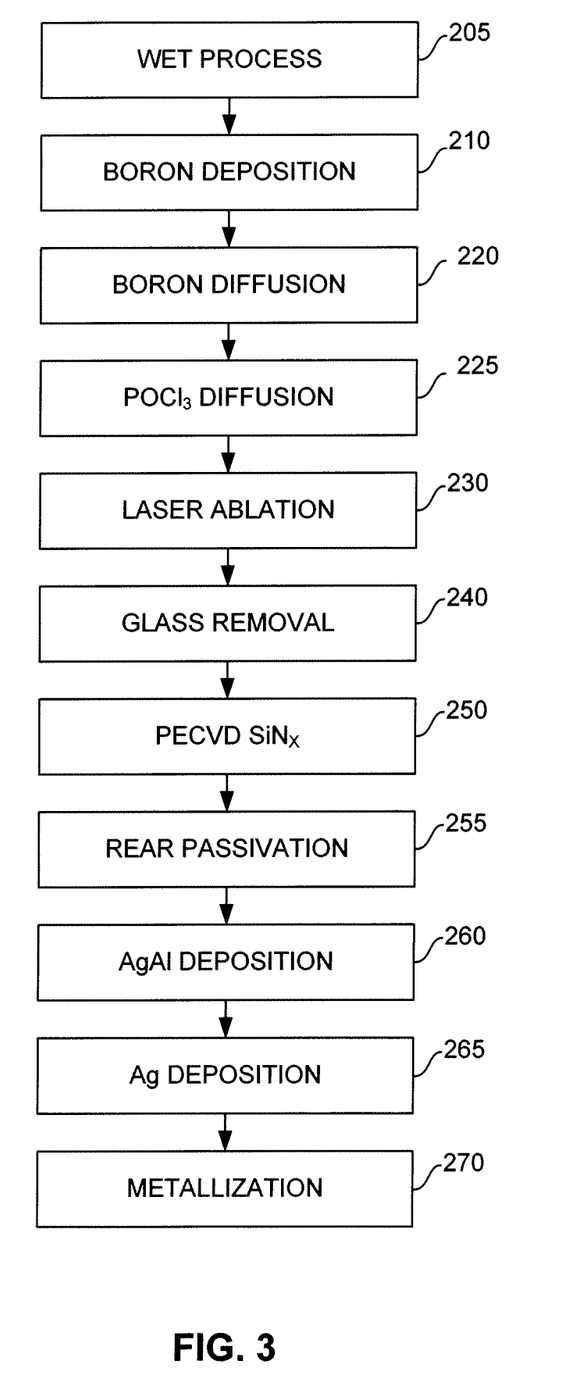
FIG. 3 is a flow diagram depicting a method for fabricating IBC solar cells according to another embodiment of the present invention.

FIG. 3 is a flow diagram depicting a method for fabricating IBC solar cells according to another embodiment of the present invention. FIGS. 4(A) to 4(K) are simplified cross-sectional side views depicting the process of FIG. 3.

Figure 4A:
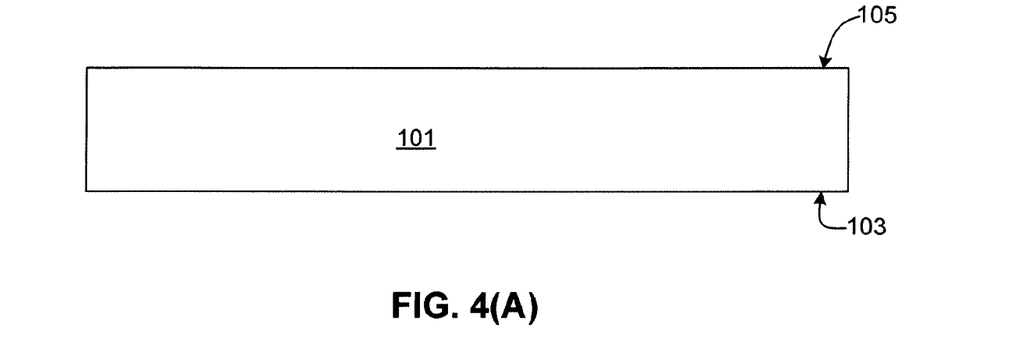
FIGS. 4(A), 4(B), 4(C), 4(D), 4(E), 4(F), 4(G), 4(H), 4(I), 4(J) and 4(K) are cross-sectional side views showing an IBC solar cell during various stages of the fabrication process of FIG. 3.

Referring to the top of FIG. 3 (block 205) and to FIG. 4(A), silicon wafer 101 is wet processed to facilitate surface texturing and cleaning on rear surface 103 and front surface 105.

Figure 4B:
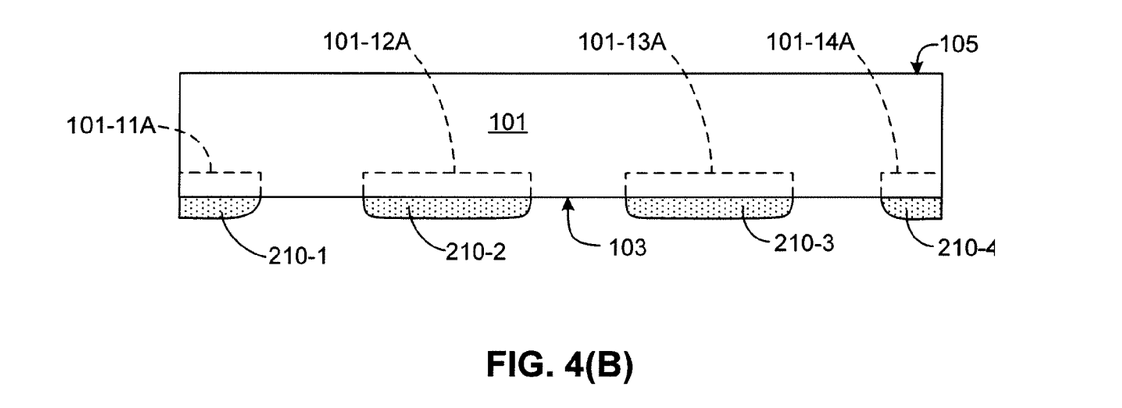

Next, referring to block 210 of FIG. 3 and to FIG. 4(B), a p-type dopant source (e.g., a printable Boron paste) is then deposited on rear surface 103 in strips having a width in the range of 100 to 3000 µm, and more preferably in the range of 1000 to 1200 µm, and with a spacing in the range of 10 to 500 µm, and more preferably in the range of 200 to 300 µm. In one embodiment, the deposition of the p-type dopant source includes an extrusion process such as that described in co-owned and co-pending U.S. Patent Application No. 20080138456, entitled "Solar Cell Fabrication Using Extruded Dopant-Bearing Materials", which is incorporated herein by reference in its entirety. In another embodiment, the deposition of the p-type dopant source includes a well known printing process, such as screen printing, pad printing, or jet printing. As indicated in FIG. 4(B), the resulting dopant material pads 210-1 to 210-4 are disposed over regions 101-11A to 101-14A, respectively, which at this point in time are substantially undoped. A drying process is then performed to dry the dopant material before diffusion.

Figure 4C:
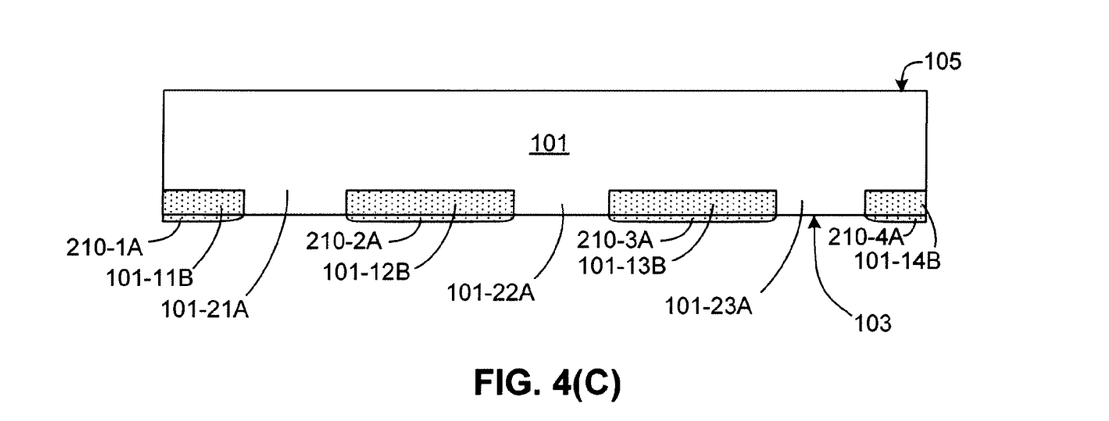

Referring to block 220 of FIG. 3 and to FIG. 4(C), diffusion of the boron into substrate 101 is then performed by placing substrate 101 into a preheated $POCl_3$ furnace with the $POCl_3$ source turned off, the furnace temperature to 900-950° C. to promote boron diffusion through rear surface 103, thereby forming diffusion regions 101-11B to 101-14B. In addition, in accordance with another aspect of the invention, the temperature during the boron diffusion process is selected such that the boron source material forms borosilicate glass layers 210-1A to 210-4A on rear surface 104 over diffusion regions 101-11B to 101-14B. Note that, after the boron diffusion process, diffusion regions 101-11B to 101-14B are separated by substantially undoped regions 101-21A to 101-23A.

Figure 4D:
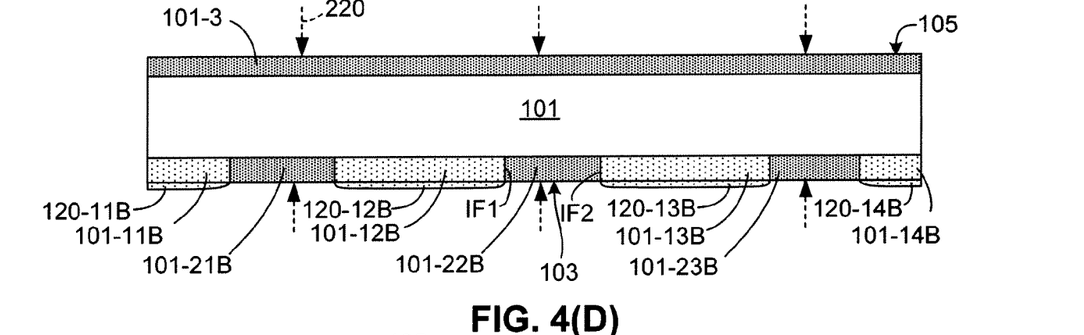

Referring to block 225 of FIG. 3 and to FIG. 4(D), diffusion of phosphorus (n-type dopant) into substrate 101 is then performed by cooling the $POCl_3$ furnace from the boron diffusion temperature (i.e., 900-950° C.) to a temperature in the range of 850-900° C. and then turning on the $POCl_3$ at a rate sufficient to achieve the phosphorus doping profile described herein. As indicated in FIG. 4(D), phosphorus (indicated by dashed line arrows) enters substrate 101 through front surface 105 and through exposed portions of rear surface 103, thereby forming n-type diffusion regions 101-21B to 101-23B and 101-3. In accordance with an aspect of the present invention, borosilicate glass layers 210-1A to 210-4A serve as diffusion barriers during the phosphorus diffusion process to prevent diffusion of phosphorus into diffusion regions 101-11B to 101-14B. The inventors believe that by lowering the furnace temperature below 900° C., the borosilicate glass formed during boron diffusion can effectively serve as a barrier for phosphor diffusion. Note that, at the end of the phosphorus diffusion process shown in FIG. 4(D), each adjacent diffusion region abuts its adjacent diffusion region (e.g., diffusion region 101-12B abuts diffusion region 101-22B at interface IF1, and diffusion region 101-22B abuts diffusion region 101-13B at interface IF2).

Figure 4E:
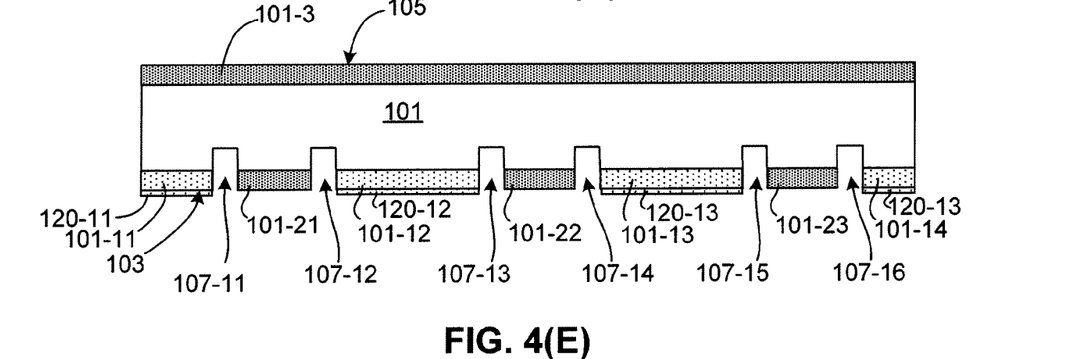

Referring to block 230 of FIG. 3 and to FIG. 4(E), grooves 107-11 to 107-16 are then formed in rear surface 103 at each interface between adjacent diffusion regions, whereby each groove separates adjacent p+ and n+ diffusion region pairs. In accordance with an aspect of the present invention, the groove formation process is performed by laser ablation using such as a Q-switched solid state laser with a pulse energy in a range such as from about 10 μJ to about 300 μJ whereby grooves are formed having a depth of approximately in the range of 0.5 μm to 5 μm and a width in the range of 5 to 50 μm.

Figure 4F:
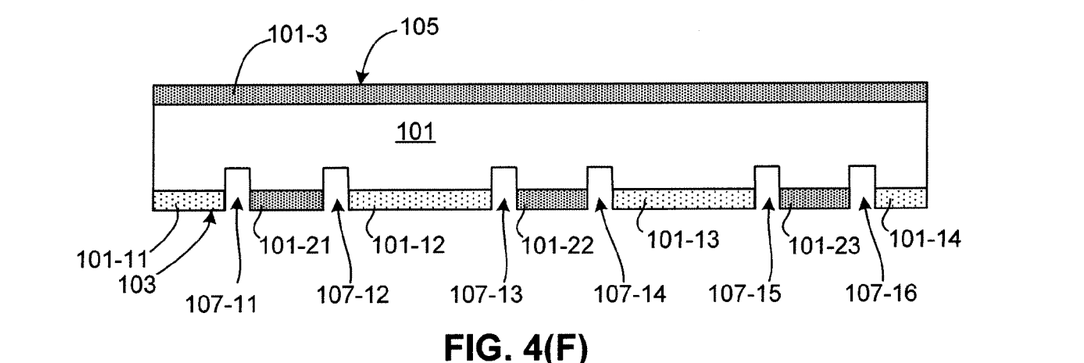

Referring to block 240 of FIG. 3 and to FIG. 4(F), glass removal is then performed to remove remaining borosilicate glass pads 120-11 to 120-14 (shown in FIG. 4(E). In one embodiment, glass removal is performed using a wet chemical solution according to known techniques such as acid wet etching.

Figure 4G:
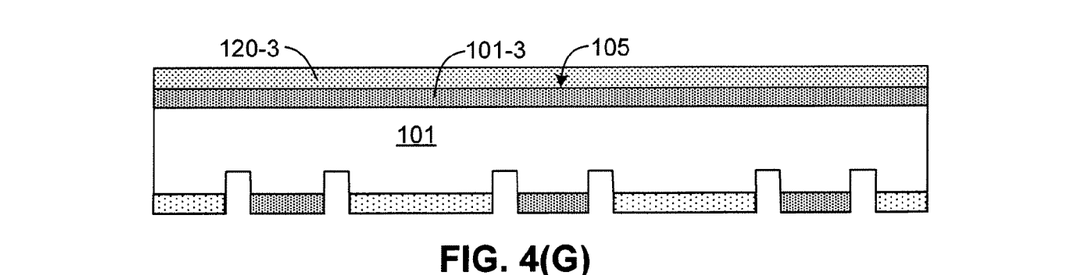
Figure 4H:
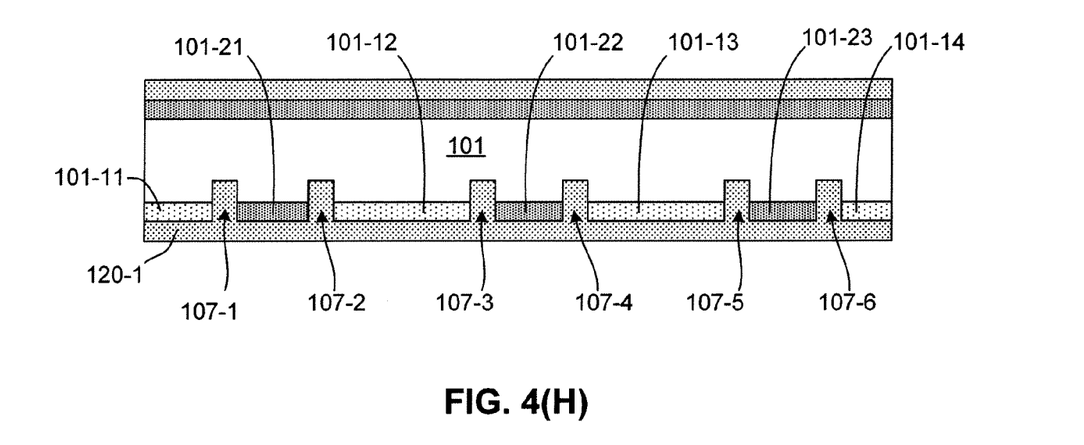

As shown in FIG. 3 (blocks 250 and 255) and in FIGS. 4(G) and 4(H), a SiNx anti-reflection layer 120-3 is then deposited in a PECVD reactor on front surface 105 over diffusion region 101-3, and then a surface passivation layer (e.g., SiNx, SiCx, SiO2/SiNx) is deposited on rear surface 103 according to known techniques such as PECVD or sputtering.

Figure 4I:
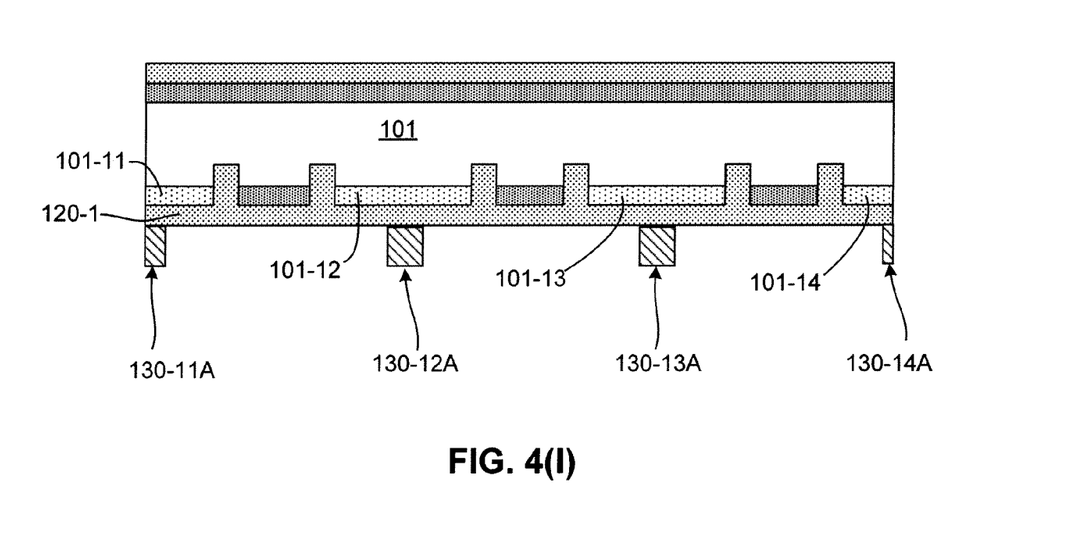
Figure 4J:
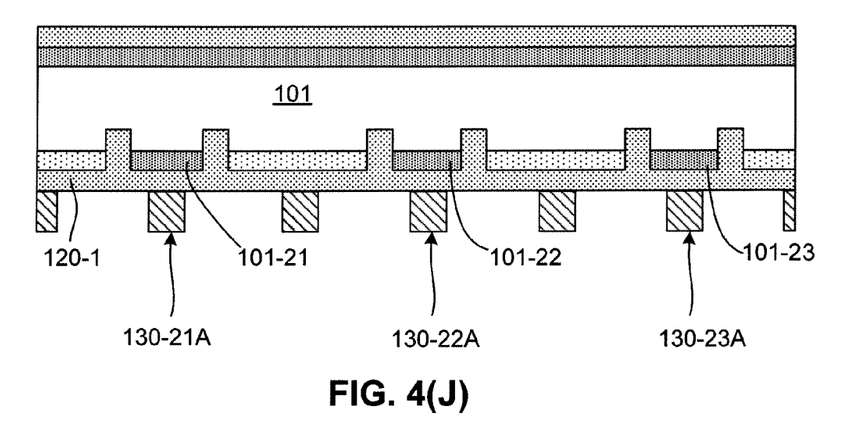
Figure 4K:
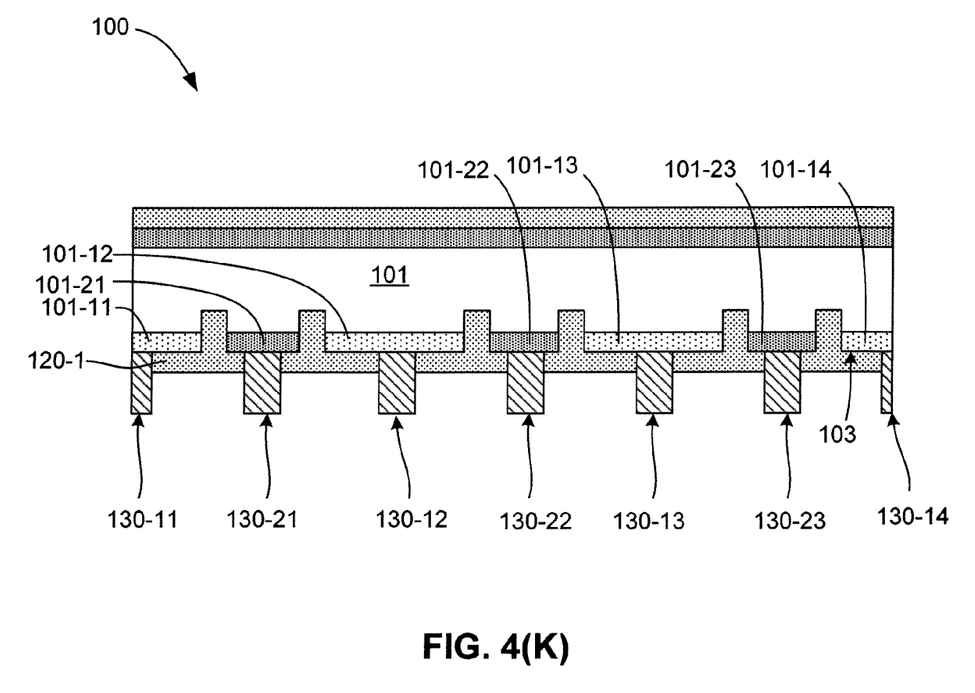

Referring to the lower portion of FIG. 3 and to FIGS. 4(I) and 4(J), AgAl paste portions 130-11A to 130-14A are respectively disposed on passivation layer 120-1 over p+ diffusion regions 101-11 to 101-14 (block 260 and FIG. 4(I)), and Ag paste portions 130-21A to 130-23A are respectively disposed on passivation layer 120-1 over n+ diffusion regions 101-21 to 101-23 (block 265 and FIG. 4(J)). In an alternative embodiment, Ag paste is deposited on both p+ diffusion regions 101-11 to 101-14 and n+ diffusion regions 101-21 to 101-23 simultaneously using, for example, screen printing or extrusion, thereby eliminating one process step and reducing the entire fabrication process to ten steps. Subsequent to the paste deposition (see block 270 of FIG. 3 and FIG. 4(K)), substrate 101 is heated in a belt furnace to induce metallization, whereby metal contacts 130-11 to 130-14 are formed through passivation layer 120-1 to p+ diffusion regions 101-11 to 101-14, and metal contacts 130-21 to 130-23 are formed through passivation layer 120-1 to n+ diffusion regions 101-21 to 101-23.

An advantage of the present invention is that IBC solar cell 100 (FIG. 1) can be fabricated with only ten process steps, which is seven steps less than conventional IBC cell fabrication processes (i.e., as described in D. H. Neuhaus and A. Munzer, "Industrial Silicon Wafer Solar Cells" (Advances in Optoelectronics, vol. 2007, pp. 1-15, 2007)), and only one step more than the fabrication process typically used to produce conventional 'H-pattern' solar cells. In additions, because the present invention enables the formation of IBC cells, the cost of module assembly, which accounts for 30-35% of the total solar cell module cost, is reduced by up to 30% over conventional "H-pattern" cell assembly, indicating that a 9.0-10.5% reduction in total module cost is possible, according to E. V. Kerschaver and G. Beaucarne, "Back-contact Solar Cells: Review," Progress in Photovoltaics: Research and Applications, vol. 14, pp. 107-123, 2006. Moreover, as the bow of wafers, which is usually caused by depositing Al paste and forming Al BSF (back surface field) on the entire rear surface in conventional "H-pattern" cells, can be greatly reduced or even eliminated for IBC cells, it is much easier to use thin Si wafers to produce IBC solar cells, which will also reduce the cost of Si materials. With these cost reductions both on module assembly and Si materials, the present invention (which just has minor process cost increase comparing to conventional "H-pattern" cells) reduces the final cost by up to about 20%, comparing to conventional cells even without efficiency improvement. Further, cost reduction to 30% are potentially realized because, in general, IBC cells have higher efficiency than the conventional "H-pattern" cells. The cost/efficiency analysis is provided in Table 1 (below).

TABLE 1

Cost and Efficiency Analysis

|  | Base | No process | High η | More η | PARC I | PARC II |
|---|---|---|---|---|---|---|
| Si | 100 | 100 | 100 | 100 | 75 | 75 |
| Process | 100 | 0 | 100 | 100 | 120 | 120 |
| Module | 100 | 100 | 100 | 100 | 70 | 70 |
| Eff. (%) | 17.0 | 17.0 | 20.0 | 24.3 | 17.0 | 19.4 |
| Power (W) | 4.14 | 4.14 | 4.87 | 5.91 | 4.14 | 4.73 |
| $/W | 2.50 | 2.13 | 2.12 | 1.75 | 2.00 | 1.75 |
| Cost reduction | NA | 15% | 15% | 30% | 20% | 30% |

As indicated in the leftmost column of Table 1, the baseline process is provided with costs of Si material, process, and module. Each cost accounts for 50%, 15%, and 35% of total module cost. The baseline process has 100% of Si material cost, 100% of processing cost, and 100% of module assembly cost, which result in total manufacturing cost of $2.50/W. Also, the cell/module efficiency is assumed to be 17%. The next cost analysis (second column from left) investigates the manufacturing cost without any processing. Therefore, the processing cost is 0%. Assuming that the module is able to produce an efficiency of 17%, the manufacturing cost is $2.13/W, which represents 15% reduction in cost. The primary target of the present invention is to achieve 30% cost reduction, so the "no process" option is not enough. The next cost analysis analyzes the impact of high-efficiency module, 20%. Assuming the production of 20%-efficient modules without adding any process compared to the baseline process, this option would produce a manufacturing cost of $2.12/W, which represents 15% reduction in cost. A 20% efficiency module does not produce enough cost reduction. Therefore, the next step is to analyze the effect of an even higher cell efficiency, 24.3%, on cost. This higher efficiency module gives the manufacturing cost of $1.75/W, which represents 30% reduction in cost. However, achieving 24.3% without adding any process compared to the baseline process is highly unlikely. The next step, PARC I, is the result of cost analysis using the proposed device fabrication technologies. Our proposed IBC cells will be able to accept thin Si wafers, 100-150 μm thick. Therefore, the cost of Si material is reduced to 75% of its original value. The cell processing requires boron diffusion, laser ablation, and alignment/registration processes. Therefore, the processing cost is assumed to be increased 20%. As discussed in the previous section, the cost of module assembly is reduced to 70% of its original value because the IBC structure provides a simpler module assembly process.

Assuming that the cell/module efficiency is unchanged (17%), the manufacturing cost would be $2.00/W, which represents 20% reduction in cost. In order to achieve 30% cost reduction using the proposed IBC cells, the cell/module efficiency needs to be improved to 19.4% from 17.0%, and this is very realistic for IBC cells. Hence, as demonstrated in Table 1, the present invention facilitates the production of IBC solar cells having a final cost reduced by up to about 20% over conventional "H-pattern" cells (assuming the same efficiency), and having a cost reduction of 30% or more when the higher efficiency of the IBC solar cells is taken into account.

Although the present invention has been described with respect to certain specific embodiments, it will be clear to those skilled in the art that the inventive features of the present invention are applicable to other embodiments as well, all of which are intended to fall within the scope of the present invention. For example, although the present invention is described above with reference to n-type Si substrates, it is possible to start with p-type Si substrate.

In this case, the width of boron source would be in the range of about 10 to 500 μm, and more preferably in the range of 200-300 μm, and the spacing would be in the range of 100-3000 μm, and more preferably in the range of 1000-1200 μm. In addition, the present invention is not necessarily limited to the use of boron and phosphorus as dopants (unless specified in the claims), and is intended to extend to any other dopants exhibiting the diffusion barrier characteristics described herein, such as gallium (Ga) and arsenic (As). Moreover, the formation of grooves to separate the p+ and n+ diffusion regions is not necessarily limited to laser ablation, and may be extended to any other suitable method capable of generating the grooves described herein. For example, the grooves can also be made by using selective chemical etching methods through such as printing or extruding an etching paste on the rear surface of the substrate.

The invention claimed is:

1. A method of fabricating an interdigitated back contact solar cell, the method comprising:
    diffusing a first dopant into a rear surface of a semiconductor substrate such that first and second spaced-apart diffusion regions of the substrate have a first doping concentration and extends a first depth into the substrate from the rear surface, and are separated by a third diffusion region having a second doping concentration and extending a second depth into the substrate from the rear surface; and
    forming a plurality of grooves in the rear surface of the semiconductor substrate, wherein each of the plurality of grooves is disposed between an associated adjacent pair of said plurality of interdigitated diffusion regions such that the first diffusion region is separated from the third diffusion region by a first groove, such that the second diffusion region is separated from the third diffusion region by a second groove, wherein each of the plurality of grooves includes a corresponding pair of side walls that extend into the substrate from the rear surface, and wherein said third diffusion region extends continuously from a first side wall of said first groove to a second side wall of said second groove and has a third depth into the substrate from the rear surface that is greater than the first and second depths.

2. The method according to claim 1, wherein diffusing the first dopant comprises:
    depositing spaced-apart dopant material pads comprising said first dopant onto the rear surface of substrate over first and second substrate regions; and
    heating the substrate such that a portion of the first dopant diffuses into said first and second substrate regions through said rear surface to form said first and second diffusion regions,
    respectively, wherein the second doping concentration of the third diffusion region maintains said second doping concentration during said heating.

3. The method according to claim 2, wherein depositing the spaced-apart pads of said first dopant comprises one of extruding, screen printing, pad printing or jet printing said first dopant onto said rear surface.

4. The method according to claim 3,
    wherein said first dopant comprises boron, and
    wherein heating comprises heating a temperature such that borosilicate glass is formed on said rear surface over said first and second substrate regions.

5. The method according to claim 4, further comprising, after forming said borosilicate glass, diffusing an n-type dopant into a third substrate region disposed between said first and second substrate regions such that said borosilicate glass prevents diffusion of said n-type dopant into said first and second substrate regions, and such that said n-type dopant forms said third diffusion region.

6. The method according to claim 5, wherein diffusing the n-type dopant comprises disposing said substrate in a furnace containing $POCl_3$ at a temperature below 900° C.

7. The method according to claim 2, further comprising, after said first dopant material is diffused into said first and second substrate regions to form said first and second diffusion regions, diffusing a second dopant material into a third substrate region disposed between said first and second substrate regions such that said first dopant in said first and second diffusion regions serves as a diffusion barrier, whereby said third substrate region acquires a third doping concentration determined by said second dopant material to form said third diffusion region, and said first and second diffusion regions maintain said first doping concentration.

8. The method according to claim 2, wherein forming said plurality of grooves on the rear surface of the substrate comprises selectively laser ablating the rear surface of the substrate.

9. The method according to claim 2, wherein forming said plurality of grooves on the rear surface of the substrate comprises selectively chemical etching the rear surface of the substrate.

10. The method according to claim 2, wherein each of the first and second grooves has a third depth extending into substrate from said rear surface that is greater than either of the first depth and the second depth.

11. A method of fabricating an interdigitated back contact solar cell, the method comprising:
    diffusing a first dopant into a rear surface of a semiconductor substrate such that first and second spaced-apart diffusion regions of the substrate have a first doping concentration and extends a first depth into the substrate from the rear surface, and are separated by a third diffusion region having a second doping concentration and extending a second depth into the substrate from the rear surface;
    removing an elongated first portion of the semiconductor substrate that extends a third depth into the rear surface and is disposed between the first diffusion region and the third diffusion region such that the first diffusion region is entirely separated from the third diffusion region by a first groove; and
    removing an elongated second portion of the semiconductor substrate that extends said third depth into the rear surface and is disposed between the second diffusion region and the third diffusion region such that the second diffusion region is entirely separated from the third diffusion region by a second groove, wherein said third diffusion region extends continuously from a first side wall of said first groove to a second side wall of said second groove, and wherein the third depth is greater than either of the first depth and the second depth.

12. The method according to claim 11, wherein removing said first portion and said second portion comprises chemical etching the rear surface of the substrate.

13. The method according to claim 11, wherein removing said first portion and said second portion comprises laser ablating the rear surface of the substrate.

14. A method of fabricating an interdigitated back contact solar cell, the method comprising:

diffusing a first dopant into a rear surface of a semiconductor substrate such that first and second spaced-apart diffusion regions of the substrate have a first doping concentration and extends a first depth into the substrate from the rear surface, diffusing a second dopant into the rear surface of the semiconductor substrate such that a third diffusion region of the substrate has a second doping concentration and extends a second depth into the substrate from the rear surface, the third diffusion region being disposed between the first and second diffusion regions; and removing an elongated first portion of the semiconductor substrate that extends a third depth into the rear surface and is disposed between the first diffusion region and the third diffusion region and an elongated second portion of the semiconductor substrate that extends said third depth into the rear surface and is disposed between the second diffusion region and the third diffusion region, said elongated first and second portions being formed such that the first diffusion region is entirely separated from the third diffusion region by a first groove, and such that the second diffusion region is entirely separated from the third diffusion region by a second groove, wherein said third diffusion region extends continuously from a first side wall of said first groove to a second side wall of said second groove, and wherein the third depth is greater than either of the first depth and the second depth.

15. The method according to claim 14, wherein removing said first portion and said second portion comprises chemical etching the rear surface of the substrate.

16. The method according to claim 14, wherein removing said first portion and said second portion comprises laser ablating the rear surface of the substrate.

\* \* \* \* \*